(12) United States Patent
Murali et al.

(10) Patent No.: US 8,841,161 B2
(45) Date of Patent: Sep. 23, 2014

(54) METHOD FOR FORMING FLEXIBLE SOLAR CELLS

(75) Inventors: Venkatesan Murali, San Jose, CA (US); Gopal Prabhu, San Jose, CA (US); Thomas Edward Dinan, Jr., San Jose, CA (US); Orion Leland, Fremont, CA (US)

(73) Assignee: GTAT.Corporation, Merrimack, NH (US)

( * ) Notice: Subject to any disclaimer, the term of this patent is extended or adjusted under 35 U.S.C. 154(b) by 0 days.

(21) Appl. No.: 13/366,338

(22) Filed: Feb. 5, 2012

(65) Prior Publication Data

US 2013/0199611 A1 Aug. 8, 2013

(51) Int. Cl.
*H01L 31/0376* (2006.01)
*H01L 31/18* (2006.01)

(52) U.S. Cl.
USPC ............... 438/96; 438/68; 136/253; 136/255; 136/256; 136/259

(58) Field of Classification Search
USPC ............... 136/253, 255, 256, 259; 438/68, 96
See application file for complete search history.

(56) References Cited

U.S. PATENT DOCUMENTS

| | | | |
|---|---|---|---|
| 4,451,969 A | 6/1984 | Chaudhuri | |
| 4,968,372 A | 11/1990 | Maass | |
| 6,091,021 A | 7/2000 | Ruby et al. | |
| 6,127,623 A * | 10/2000 | Nakamura et al. | 136/256 |
| 6,486,008 B1 | 11/2002 | Lee | |
| 6,518,596 B1 | 2/2003 | Basore | |
| 6,534,382 B1 | 3/2003 | Sakaguchi et al. | |
| 6,809,044 B1 | 10/2004 | Aspar et al. | |
| 7,531,428 B2 | 5/2009 | Dupont | |
| 7,842,585 B2 | 11/2010 | Sivaram et al. | |
| 7,985,604 B2 | 7/2011 | Isaka et al. | |
| 8,101,451 B1 | 1/2012 | Murali et al. | |
| 8,173,452 B1 | 5/2012 | Petti et al. | |
| 2002/0174959 A1 | 11/2002 | Yanagita et al. | |

(Continued)

FOREIGN PATENT DOCUMENTS

| | | |
|---|---|---|
| EP | 1547146 B1 | 9/2011 |
| JP | 2003017723 A | 1/2003 |

(Continued)

OTHER PUBLICATIONS

International Search Report and Written Opinion dated May 1, 2013 for PCT Application No. PCT/US2013/024682.

(Continued)

*Primary Examiner* — Mathew Martin
(74) *Attorney, Agent, or Firm* — The Mueller Law Office, P.C.

(57) ABSTRACT

The invention provides for a semiconductor wafer with a metal support element suitable for the formation of a flexible or sag tolerant photovoltaic cell. A method for forming a photovoltaic cell may comprise providing a semiconductor wafer have a thickness greater than 150 μm, the wafer having a first surface and a second surface opposite the first and etching the semiconductor wafer a first time so that the first etching reduces the thickness of the semiconductor wafer to less than 150 μm. After the wafer has been etched a first time, a metal support element may be constructed on or over the first surface; and a photovoltaic cell may be fabricated, wherein the semiconductor wafer comprises the base of the photovoltaic cell.

15 Claims, 5 Drawing Sheets

(56) References Cited

U.S. PATENT DOCUMENTS

| | | | |
|---|---|---|---|
| 2003/0087479 A1 | 5/2003 | He et al. | |
| 2005/0093100 A1 | 5/2005 | Chen et al. | |
| 2006/0255340 A1 | 11/2006 | Manivannan et al. | |
| 2007/0017566 A1 | 1/2007 | Gaudiana et al. | |
| 2008/0179547 A1 | 7/2008 | Henley | |
| 2008/0265255 A1 | 10/2008 | Goyal | |
| 2008/0296584 A1 | 12/2008 | Hachigo | |
| 2009/0020592 A1 | 1/2009 | Lee et al. | |
| 2009/0189126 A1 | 7/2009 | Prunchak | |
| 2009/0194153 A1 | 8/2009 | Hilali et al. | |
| 2009/0194162 A1 | 8/2009 | Sivaram et al. | |
| 2009/0194164 A1* | 8/2009 | Sivaram et al. | 136/258 |
| 2009/0223562 A1 | 9/2009 | Niira et al. | |
| 2009/0280597 A1 | 11/2009 | Wijekoon et al. | |
| 2010/0129951 A1 | 5/2010 | Henley | |
| 2010/0147448 A1 | 6/2010 | Agarwal et al. | |
| 2010/0224911 A1 | 9/2010 | Okita et al. | |
| 2010/0273329 A1 | 10/2010 | Prabhu et al. | |
| 2010/0307572 A1 | 12/2010 | Bedell et al. | |
| 2010/0307582 A1* | 12/2010 | Arai | 136/256 |
| 2010/0319765 A1 | 12/2010 | Choi | |
| 2010/0326510 A1 | 12/2010 | Agarwal et al. | |
| 2010/0330788 A1 | 12/2010 | Yu et al. | |
| 2011/0171812 A1 | 7/2011 | Letertre et al. | |
| 2011/0174376 A1 | 7/2011 | Lochtefeld et al. | |
| 2011/0186910 A1 | 8/2011 | Forrest et al. | |
| 2011/0221040 A1 | 9/2011 | Joshi et al. | |
| 2011/0248265 A1 | 10/2011 | Forbes | |
| 2011/0311789 A1 | 12/2011 | Loy et al. | |
| 2012/0024377 A1 | 2/2012 | Takanashi et al. | |
| 2012/0067423 A1* | 3/2012 | Lochtefeld et al. | 136/261 |
| 2012/0068345 A1 | 3/2012 | Schmidt et al. | |
| 2012/0119224 A1 | 5/2012 | Tai et al. | |
| 2012/0199845 A1 | 8/2012 | Werkhoven et al. | |

FOREIGN PATENT DOCUMENTS

| | | | |
|---|---|---|---|
| KR | 20060024763 A | 3/2006 | |
| KR | 20060115990 A | 11/2006 | |
| KR | 20080109711 A | 12/2008 | |
| KR | 20100097537 A | 9/2010 | |
| KR | 112011003788 A | 1/2011 | |
| KR | 20120006844 A | 1/2012 | |
| KR | 20120041165 A | 4/2012 | |
| KR | 20120050484 A | 5/2012 | |
| WO | 03003434 A1 | 1/2003 | |

OTHER PUBLICATIONS

International Search Report and Written Opinion dated May 1, 2013 for PCT Application No. PCT/US2013/024683.
International Search Report and Written Opinion dated May 16, 2013 for PCT Application No. PCT/US2013/024681.
Tsunomura et al., "22%-Efficiency Hit Solar Cell", Apr. 24, 2008. Advanced Energy Research Center, Sanyo Electric Co., Ltd, pp. 1-4, Japan.
International Search Report and Written Opinion dated Sep. 16, 2013 for PCT Application No. PCT/US2013/044622.
Notice of Allowance and Fees dated Jul. 30, 2013 for U.S. Appl. No. 12/750,635.
Office Action dated Aug. 1, 2013 for U.S. Appl. No. 13/494,687.
Office action dated Jul. 22, 2013 for U.S. Appl. No. 13/558,826.
Office action dated Jul. 22, 2013 for U.S. Appl. No. 13/558,836.
International Search Report and Written Opinion dated Nov. 26, 2013 for PCT Patent Application No. PCT/US2013/054443.
Office Action dated Nov. 18, 2013 for U.S. Appl. No. 13/494,687.
Office Action dated Nov. 8, 2013 for U.S. Appl. No. 13/689,628.
Official Letter and Search report dated Sep. 24, 2013 for Taiwanese application No. 98102109.
Examination Report dated Feb. 5, 2014 for European Patent Application No. 09152007.2.
International Search Report and Written Opinion dated Jan. 29, 2014 for PCT Application No. PCT/US2013/053316.
International Search Report and Written Opinion dated Nov. 27, 2013 for PCT Application No. PCT/US2013/051541.
Office Action dated Dec. 10, 2013 for U.S. Appl. No. 13/558,826.
Office Action dated Jan. 15, 2014 for U.S. Appl. No. 13/558,836.
Office Action dated Jan. 8, 2014 for Chinese Patent Application No. 200910000496.1.

\* cited by examiner

METHOD FOR FORMING FLEXIBLE SOLAR CELLS

BACKGROUND OF THE INVENTION

A conventional prior art photovoltaic cell includes a p-n diode. A depletion zone forms at the p-n junction, creating an electric field. Incident photons will knock electrons from the valence band to the conduction band, creating free electron-hole pairs. Within the electric field at the p-n junction, electrons tend to migrate toward the n region of the diode, while holes migrate toward the p region, resulting in current called photocurrent. Typically the dopant concentration of one region will be higher than that of the other, so the junction is either a p+/n− junction or a n+/p− junction. The more lightly doped region is known as the base of the photovoltaic cell, while the more heavily doped region, of opposite conductivity type, is known as the emitter. Most carriers are generated within the base, and it is typically the thickest portion of the cell. The base and emitter together form the active region of the cell. The cell also frequently includes a heavily doped contact region in electrical contact with the base, and of the same conductivity type, to improve current flow. Improved methods and apparatus are needed to produce photovoltaic cells that are useful in a variety of configurations.

SUMMARY OF THE INVENTION

The invention provides for a semiconductor wafer with a metal support element suitable for the formation of a flexible, or sag tolerant photovoltaic cell. A method for forming a photovoltaic cell may comprise providing a semiconductor wafer having a thickness greater than 150 µm, the wafer having a first surface and a second surface opposite the first, and etching the semiconductor wafer a first time so that the first etching reduces the thickness of the semiconductor wafer to less than 150 µm. After the wafer has been etched a first time, a metal support element may be constructed on or over the first surface; and a photovoltaic cell may be fabricated, wherein the semiconductor wafer comprises the base of the photovoltaic cell.

In some embodiments a second etching may be performed after the construction of a metal support element wherein the second etching reduces the thickness of the semiconductor wafer to less than 60 µm. A photovoltaic cell may then be fabricated, wherein the semiconductor wafer comprises the base of the photovoltaic cell.

In some embodiments a wafer may be bonded to a temporary carrier prior to etching and the construction of a metal support element. The photovoltaic voltaic cell may adopt a radius of curvature less than 1 meter. In some embodiments the photovoltaic cell may adopt a radius of curvature less than 1 cm.

DETAILED DESCRIPTION OF THE EMBODIMENTS

A flexible photovoltaic device is formed from a semiconductor donor wafer that is etched to a desired thickness and supported with a metal support element so that the resultant photovoltaic device may sag or bend while retaining photovoltaic properties. The photovoltaic cell is stabilized by the metal support element that is constructed on or above a surface of the wafer while allowing for the flexibility of the photovoltaic cell. The metal support element comprises a metal or metal alloy with a coefficient of thermal expansion that is substantially the same as the donor wafer.

Figure 1:
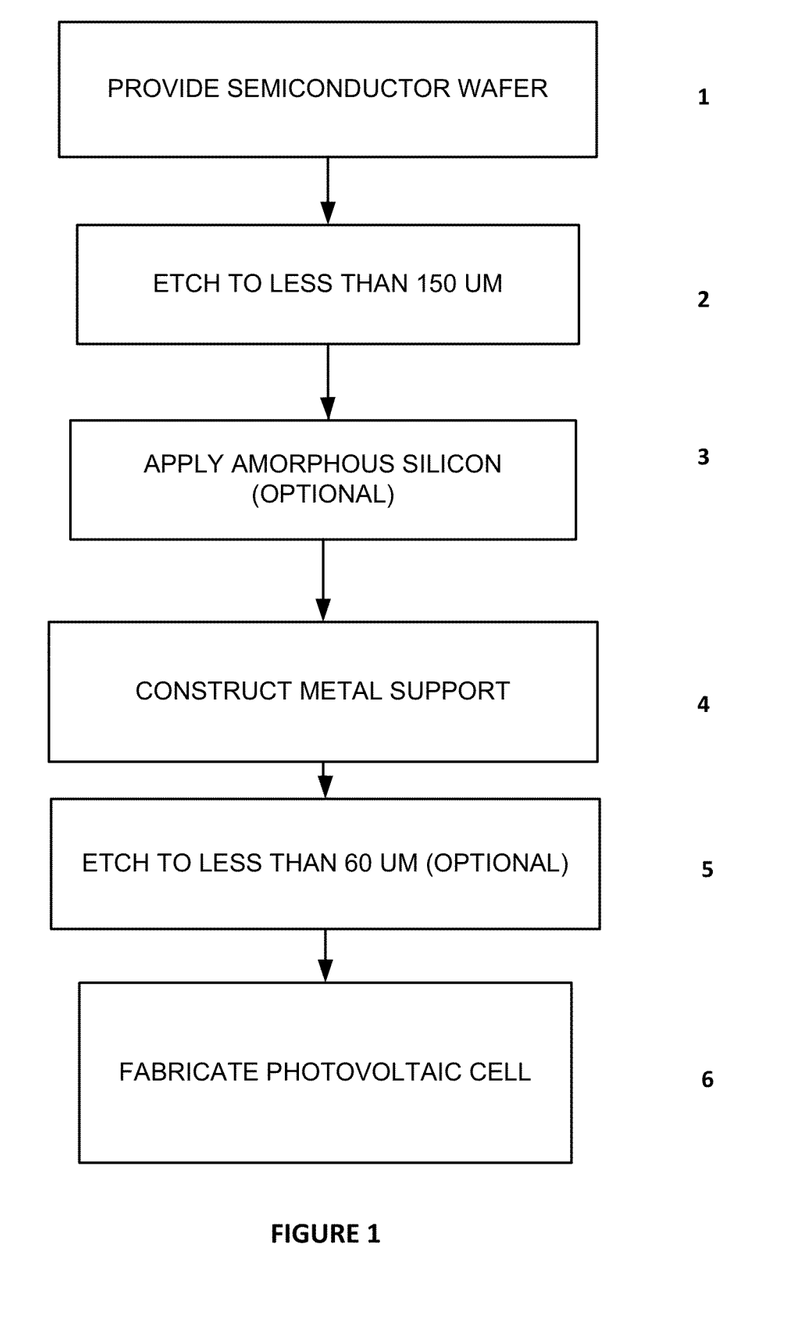
FIG. 1 shows a schematic representation of an embodiment of a method of this invention.

An embodiment of the process is schematically illustrated in FIG. 1. The process may begin with a donor wafer 1 of an appropriate material. An appropriate donor wafer may be a semiconductor wafer of any practical thickness, for example from about 150 to about 1000 microns thick or more and having a first surface and a second surface opposite the first surface. The semiconductor wafer may comprise monocrystalline silicon. Alternatively, polycrystalline or multicrystalline silicon may be used, as may microcrystalline silicon, or wafers or ingots of other semiconductor materials, including germanium, silicon germanium, or III-V or II-VI semiconductor compounds such as GaAs, InP, etc. Multicrystalline or polycrystalline semiconductors are understood to be completely or substantially crystalline. It will be appreciated by those skilled in the art that the term "monocrystalline silicon" as it is customarily used will not exclude silicon with occasional flaws or impurities such as conductivity-enhancing dopants. Wafers that are greater than 150 µm thick may undergo a first etching process 2 to reduce the thickness of the wafer to less than 150 µm, for example 100 µm. Any etching or texturing process may be used to reduce the thickness of the wafer. In some embodiments, dry plasma, alkaline treatment, acidic treatment, reactive ion, mechanical processes or any combination thereof, may be utilized to etch the wafer to a desired thickness.

In some embodiments one or more heavily doped amorphous silicon layers may be applied in step 3 of FIG. 1 to one or both surfaces of the semiconductor lamina prior to the application of a metal support element. Amorphous silicon applied to the first surface of the wafer may be doped with the same conductivity as the wafer and provide for improved current flow in the photovoltaic device. Amorphous silicon applied to the second surface may be doped with the opposite conductivity as the wafer and comprise the emitter of a photovoltaic device. An amorphous silicon layer applied to the first surface of the wafer, prior to the application of the metal support may provide for more effective passivation of the photovoltaic cell. The wafer may be more lightly doped than the amorphous silicon layer, and may serve as the base region of the photovoltaic cell. The base region of the cell absorbs incident light, and is where most charge carriers are generated. The wafer of this invention may be thinner than the absorber region of a conventional photovoltaic cell and therefore the passivation of surfaces and of the wafer is particularly important to avoid loss of charge carriers by recombination. An amorphous silicon layer is an effective means of passivation, and its use is advantageous with a very thin absorber. Additional layers may be applied to either the first or second surface of the wafer before or after the construction of a metal support element. Additional layers (e.g., reflective layers, conductive layers metal gridlines etc.) may be applied before or after the construction of a metal support element.

The metal support element may be constructed on or above the first surface of the wafer 4 of FIG. 1. That is, in some embodiments the metal support element may be constructed directly on the first surface. In other embodiments, the metal support element may be constructed with intervening layers between the first surface and the metal support, resulting in the metal support being above the first surface. The metal support element may be continuous or patterned over regions of the surface and applied by any means (e.g., electroplating, electro-less plating, sputtering etc.). In some embodiments, a continuous metal support element may cover substantially the entire first surface of the wafer or greater than 50% of the first surface of the wafer or intervening layers disposed on the wafer. In some embodiments a patterned metal support element may be a grid or mosaic pattern of metal that is applied to the wafer or intervening layers disposed on the wafer. The support element may have substantially the same coefficient of thermal expansion as the donor body over the operating temperatures of the photovoltaic cell and over the processing temperatures needed to fabricate the photovoltaic cell. The support element may comprise a metal such as nickel, cobalt, iron or any combination thereof. A seed layer comprising silver, chrome or other metal may be used to facilitate the construction of the metal support element during an electroplating process. In some embodiments the metal support element is constructed by electroplating a metal onto a seed metal layer that is applied to the first surface of the wafer or intervening layers (e.g., an amorphous silicon layer, a reflective metal layer, etc.). A support element is considered to be "constructed" if it is formed in situ, rather than being provided as a pre-formed element. Examples include: a metal support element formed by plating, for example by electroplating or electro-less plating. The metal support element may be sufficiently thick so as to provide mechanical support to wafer, which may be too thin and fragile to survive much handling without such support, and additionally provide sufficient flexibility that the completed photovoltaic device is capable of adopting a radius of curvature of one meter or less. The support element of this invention beneficially provides for the fabrication of a photovoltaic device that may sag or flex without significantly impacting the photovoltaic efficiency of the device.

The wafer may optionally undergo a second etching or thinning process 5 after the metal support element is applied, to provide for a thinner photovoltaic device such as less than 60 μm. The thinning process such as etching or texturing may be used to reduce the thickness of the semiconductor wafer still further, to less than 40 μm, 30 μm, or less than 20 μm, so that the fabricated photovoltaic cell may have the flexibility to adopt a radius of curvature less than 100, 50, 25, 5, 3 or 1 cm.

Following the construction of the metal support element on the first surface of the wafer, additional layers, such as an amorphous silicon layer and/or an indium tin oxide (ITO) layer or other layers may be deposited on the second surface of the wafer, forming a photovoltaic cell 6. A flexible glass or plastic layer may be applied to the second surface of the photovoltaic cell to cover the flexible photovoltaic module. The glass or plastic may be thin (i.e., less than 500 μm thick) and/or flexible in order to provide for a flexible or sag tolerant photovoltaic module.

In some embodiments a flexible photovoltaic module may be formed with a radius of curvature that is less than 3 cm by thinning a semiconductor wafer to less than 40 μm prior to constructing a metal support. As illustrated in the exemplary method of FIG. 2, a semiconductor wafer may be provided 1 that may be affixed to a temporary carrier 2 that can withstand the chemistry and temperature cycles of a photovoltaic cell manufacturing process. The temporary carrier may be, for example, a silicon wafer, a glass wafer, an alumina wafer, a quartz wafer or any wafer made out of any other stiff material. The temporary carrier may be bonded to the semiconductor wafer prior to the first etching process in order to stably etch 3 the wafer to a thickness less than 40 μm, for example 30 μm. In some embodiments the temporary support element may be an adhesive based carrier or a vacuum chuck or a electrostatic chuck or the like.

Figure 2:
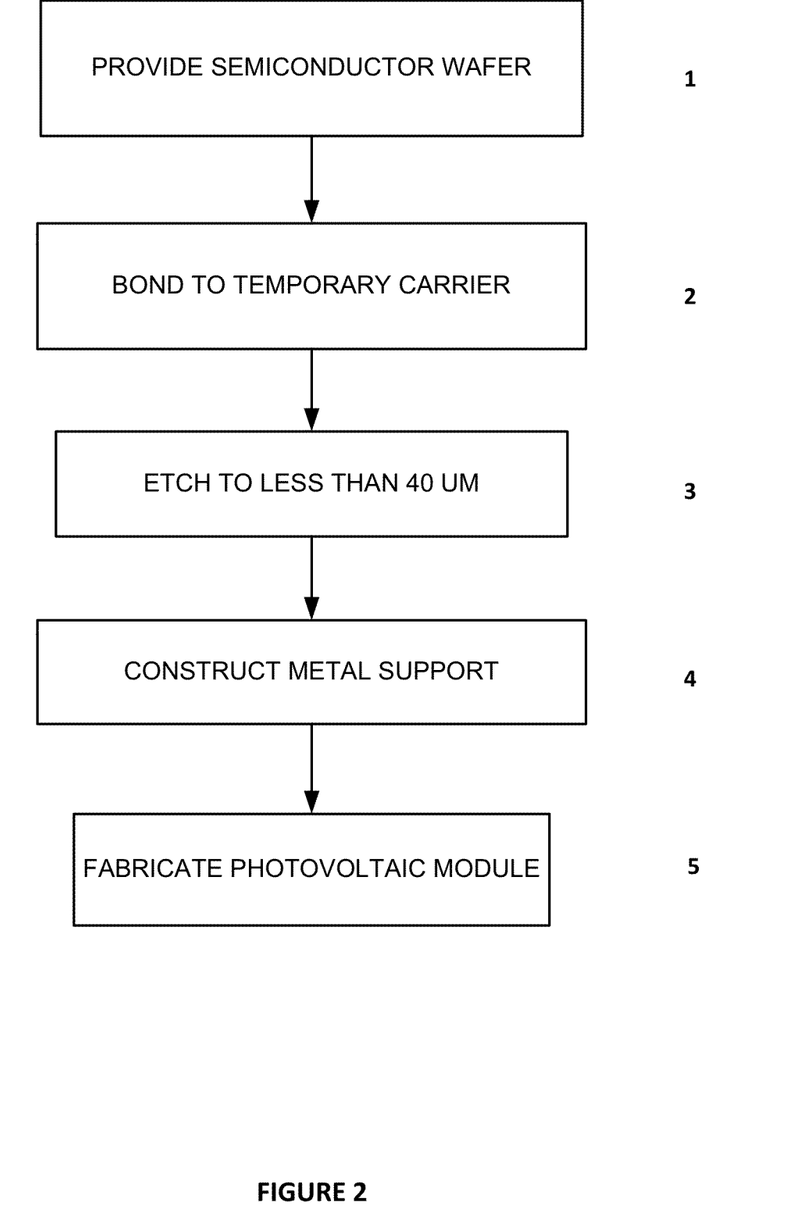
FIG. 2 shows a schematic representation of another embodiment of a method of this invention.

The metal support element may then be constructed 4 on or above the first surface of the wafer in order to provide support and flexibility to the thinned wafer after the removal of the temporary support. A photovoltaic cell may then be constructed by any means 5 such as the application of additional layers and elements to the semiconductor wafer (e.g., amorphous silicon layer, an antireflective coating, front contacts etc.).

While different flows are possible, in general a thin wafer is provided by etching, but may be provided by other means, such as a cleaved lamina from a wafer. In some embodiments a wafer may be thinned to less than 150 μm and a metal support element constructed on or above a surface of the wafer. In some embodiments a lamina may be cleaved from a donor wafer using ion implantation and cleavage methods as described in Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference, which describes fabrication of a photovoltaic cell comprising a thin semiconductor lamina formed of non-deposited semiconductor material. In some embodiments the metal support element may be constructed on a free standing lamina after it is cleaved from the donor wafer as described in Murali, et al., U.S. patent application Ser. No. 12/980,424, "A Method to Form a Device by Constructing a Support Element on a Thin Semiconductor Lamina," filed Dec. 29, 2010, owned by the assignee of the present invention and hereby incorporated by reference, which describes the fabrication of a free standing lamina and a constructed metal support element. The metal support element may have substantially the same coefficient of thermal expansion as the wafer, providing for a stable, flexible support for the fabrication and utilization of a photovoltaic cell. In some embodiments one surface of the wafer has been affixed to a temporary support and the metal support element is constructed on or above the opposite surface after etching to a desired thickness. The wafer may then be detached from the temporary support element for further processing.

Constructing a metal support element on the wafer following etching to a first thickness, as in some embodiments of the present invention, provides significant advantages. Performing the etching step prior to the application of the support element allows for both surfaces of the wafer to be etched, thus providing for efficient etching of the wafer.

Figure 3:
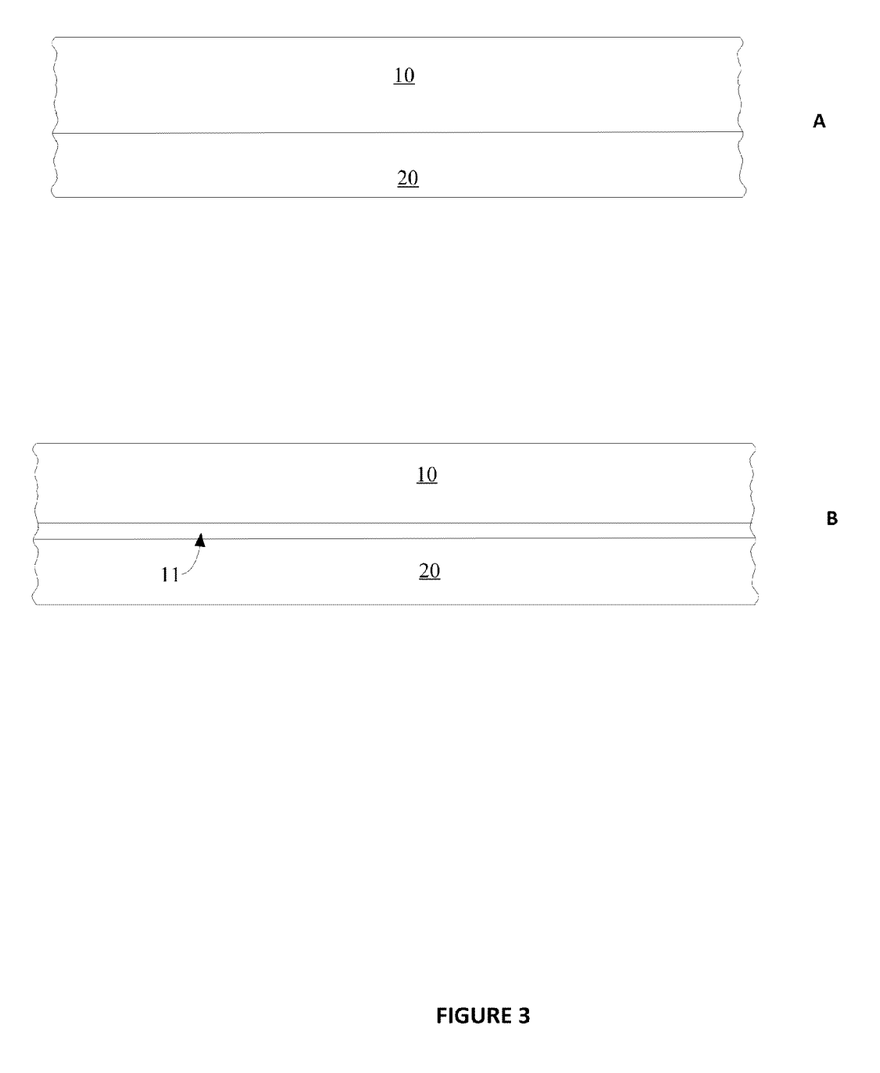
FIGS. 3A and 3B are cross sectional views showing stages of photovoltaic device formation according to embodiments of the present invention.
Figure 4:
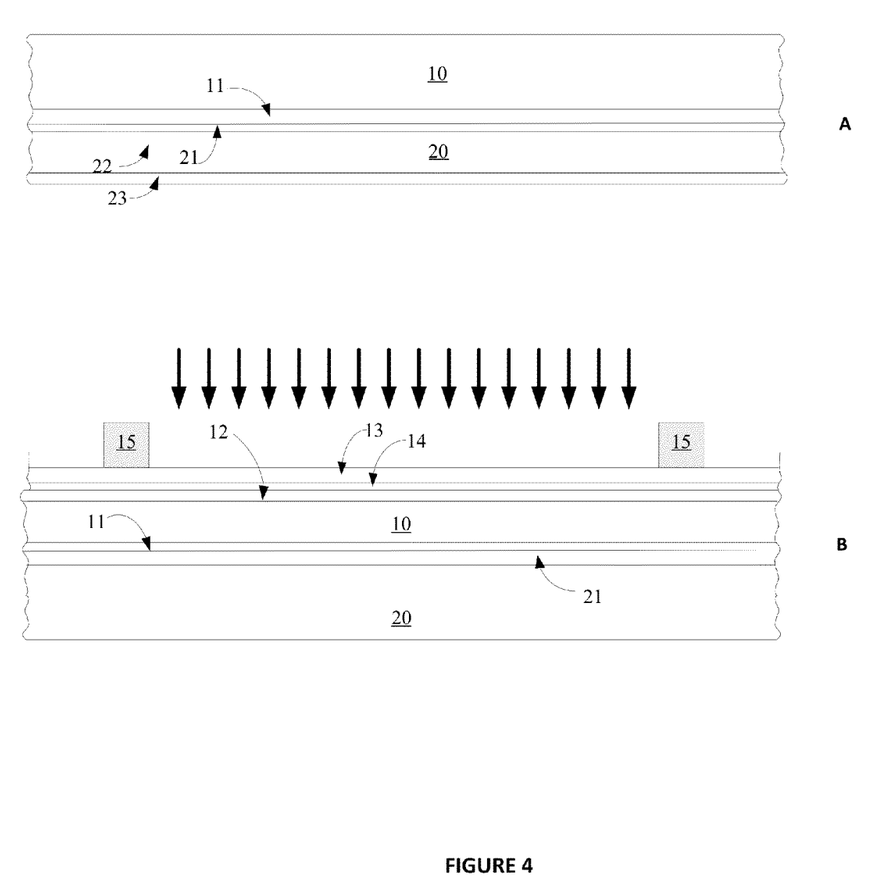
FIGS. 4A and 4B are cross sectional views showing stages of photovoltaic device formation according to embodiments of the present invention.
Figure 5:
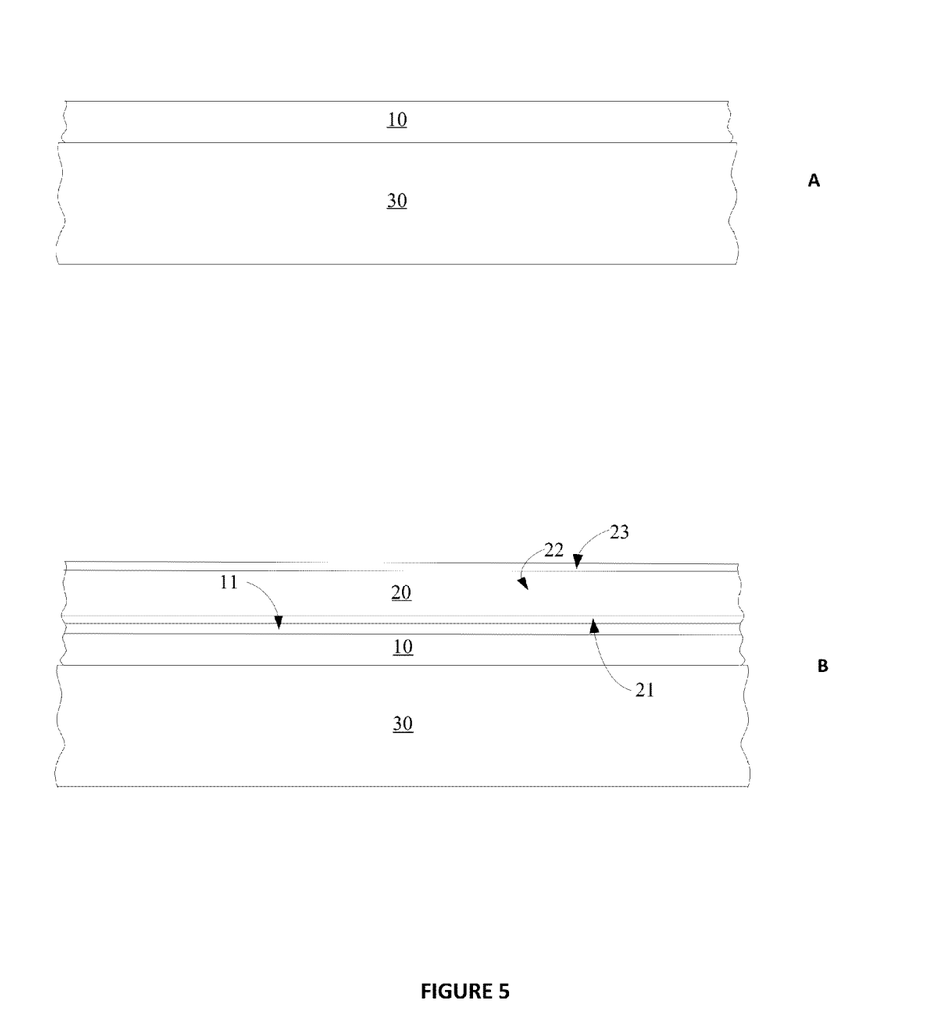
FIGS. 5A and 5B are cross sectional views showing stages of photovoltaic device formation according to embodiments of the present invention.

For clarity, detailed examples of a photovoltaic assembly including a wafer having thickness between 2 and 150 microns, such as between 20 and 100 microns, in which a metal support element is constructed on the wafer, are provided in FIGS. 3-5. FIG. 3A illustrates a silicon wafer 10 less than 150 μm thick in contact with a metal support element 20. The metal 20 may have the same, or substantially the same, coefficient of thermal expansion as the wafer and may comprise nickel and/or a nickel alloy. The metal support element 20 may comprise a seed metal layer to facilitate an electroplating process. The seed layer may comprise any metal suitable for seeding the electroplating process such as silver, chrome or any combination thereof. The metal support element 20 may provide for flexibility and support for the thin wafer 10 while in use and during the fabrication of a photovoltaic cell. The metal support element 20 may provide support during the application of materials that require elevated temperatures during application, such as amorphous silicon. A coefficient of thermal expansion in the metal support that provides a balance between the wafer and the metal support element provides for a reduction of cracking or tearing in the wafer relative to a wafer bound to a support element with a mismatched coefficient of thermal expansion. A balance may be achieved by adjusting the thickness and/or the composition of the metal support element. The metal support element 20 may be less than 30 µm thick, such as less than 20 µm or less than 10 µm thick. The metal support element may be continuous or patterned on the first surface of the wafer or on intervening layers disposed on the first surface of the wafer. As illustrated in FIG. 3B, there may be one or more intervening layers 11 between the silicon wafer 10 and the metal support element 20. The intervening layers 11 may comprise amorphous silicon, transparent conductive oxide, reflective metals, seed metals (e.g., silver), adhesion layers (e.g., chromium), anti-reflection coatings (ARC, ITO) or any combination thereof.

The metal support element 20 may comprise one, two or more metal layers as seen in FIG. 4A. At least one of the metal layers has substantially the same coefficient of thermal expansion as the silicon wafer. The matched coefficient of thermal expansion beneficially provides for improved structural integrity of the wafer during photovoltaic cell fabrication and usage. For example the metal support element of this invention provides for improved structural integrity of the wafer during the application of an amorphous silicon layer to the wafer. The one or more layers of the metal support element may comprise nickel or a nickel alloy. In some embodiments the metal support element 20 may comprise three layers made up of a first layer of nickel 21, a second layer of iron-cobalt-nickel (FeCoNi) alloy 22 and third layer of nickel 23. The total thickness of the metal support element may be any thickness needed to retain structural integrity while providing for sag tolerance and/or flexibility in the photovoltaic cell. The total thickness of the metal support element may be less than 50 µm, less than 40 µm, less than 30 µm, or less than 10 µm. In some embodiments the metal support element may be less than 7 µm thick and comprise a layer of FeCoNi alloy that is less than 6 µm, for example 5 µm, thick and a layer of nickel than is less than 1 µm thick. In some embodiments the metal support element may be less than 30 µm thick and comprise a layer of FeCoNi alloy that is less than 25 µm, for example 20 µm, thick and a layer of nickel than is less than 5 µm thick. The opposite surface of the silicon wafer may comprise any additional layers or material to provide for the photovoltaic cell. Additional layers are shown in FIG. 4B and include an amorphous silicon layer 12 disposed on the second side of the wafer. The amorphous silicon layer 12 may be doped with an opposite conductivity as the wafer 10 and comprise the emitter region of a photovoltaic cell. In some embodiments, a transparent conductive oxide (TCO) layer 13 may be formed on the amorphous silicon layer 12. In some embodiments, a layer 14 having a refractive index between that of the amorphous silicon layer 12 and the TCO layer 13 may be disposed between the amorphous silicon layer 12 and the TCO layer 13. Metal lines 15, for example of silver paste, may be formed on TCO layer 13 and provide for top electrical contact for the photovoltaic cell.

In some embodiments a silicon wafer may be bonded to a temporary support element prior to etching to a desired thickness. A temporary carrier 30 as shown in FIG. 5A may be bonded to the surface of a wafer 10 via an adhesive or any other method and may beneficially enable the wafer to be thinned to less than 60, 30, 15 µm or less prior to the construction of a metal support element. The temporary support element 30 may comprise a stiff material that can withstand the thermal and chemical conditions required to apply additional layers to the wafer for photovoltaic cell manufacture. After etching to a desired thickness, a metal support 20 and optional intervening layer 11 or layers may be constructed on the opposite surface of the wafer 10 as shown in FIG. 5B. The temporary carrier 30 may be removed by any means and photovoltaic device fabrication may proceed. In some embodiments, heating, for example to about 225° C., will cause the adhesive to soften, aiding removal. The surface may be cleaned, for example using a detergent, followed by a rinse. In some cases a solvent may be used, such as photoresist stripper. The temporary support element 30 may be cleaned, using the same methods, and subsequently re-used.

It will be understood, however, that many of these details can be modified, augmented, or omitted while the results fall within the scope of the invention.

EXAMPLE

Support Element Formed by Plating

The process begins with a donor body of an appropriate semiconductor material. An appropriate donor body may be a monocrystalline silicon wafer of any practical thickness, for example from about 200 to about 1000 microns thick or more. Typically the wafer has a <100> orientation, though wafers of other orientations may be used. Alternatively, polycrystalline or multicrystalline silicon may be used, as may microcrystalline silicon, or wafers or ingots of other semiconductor materials, including germanium, silicon germanium, or III-V or II-VI semiconductor compounds such as GaAs, InP, etc. In this context the term multicrystalline typically refers to semiconductor material having grains that are on the order of a millimeter or larger in size, while polycrystalline semiconductor material has smaller grains, on the order of a thousand angstroms. The grains of microcrystalline semiconductor material are very small, for example 100 angstroms or so. Microcrystalline silicon, for example, may be fully crystalline or may include these microcrystals in an amorphous matrix. Multicrystalline or polycrystalline semiconductors are understood to be completely or substantially crystalline. It will be appreciated by those skilled in the art that the term "monocrystalline silicon" as it is customarily used will not exclude silicon with occasional flaws or impurities such as conductivity-enhancing dopants.

The process of forming monocrystalline silicon generally results in circular wafers, but the donor body can have other shapes as well. For photovoltaic applications, cylindrical monocrystalline ingots are often machined to an octagonal, or pseudo-square, cross section prior to cutting wafers. Wafers may also be other shapes, such as square. Square wafers have the advantage that, unlike circular or hexagonal wafers, they can be aligned edge-to-edge on a photovoltaic module with minimal unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

The monocrystalline silicon wafer is lightly to moderately doped to a first conductivity type. The present example will describe a relatively lightly n-doped wafer but it will be understood that in this and other embodiments the dopant types can be reversed. The wafer may be doped to a concentration of between about $1 \times 10^{15}$ and about $1 \times 10^{18}$ dopant atoms/cm$^3$, for example about $1 \times 10^{17}$ dopant atoms/cm$^3$. The donor wafer may be, for example, solar- or semiconductor-grade silicon.

An etch step to reduce the thickness of the wafer may be performed, for example by a mix of hydrofluoric (HF) acid and nitric acid, or using KOH. Following this wet process, an amorphous silicon layer is deposited on a first surface. This layer is heavily doped silicon and may have a thickness, for example, between about 50 and about 350 angstroms. In other embodiments, this layer may be omitted. In this example, heavily doped silicon layer is heavily doped n-type, the same conductivity type as lightly doped n-type lamina. Lightly doped n-type wafer comprises the base region of the photovoltaic cell to be formed, and heavily doped amorphous silicon layer provides electrical contact to the base region.

A transparent conductive oxide (TCO) layer is formed on and in immediate contact with the amorphous silicon layer. Appropriate materials for TCO include indium tin oxide and aluminum-doped zinc oxide or any other material known in the art. This layer may be, for example, about between about 500 to about 1500 angstroms thick, for example about 750 angstroms thick. This thickness will enhance reflection from a reflective layer to be deposited. In some embodiments this layer may be substantially thinner, for example about 100 to about 200 angstroms.

In the completed device, incident light will enter the wafer at the second surface. After passing through the wafer, light that has not been absorbed will exit the wafer at the first surface, then pass through the TCO layer. A reflective layer formed on the TCO layer will reflect this light back into the cell for a second opportunity to be absorbed, improving efficiency. A conductive, reflective metal may be used for the reflective layer. Various layers or stacks may be used. In one embodiment, a reflective layer is formed by depositing a very thin layer of chromium, for example about 30 or 50 angstroms to about 100 angstroms, on the TCO layer, followed by about 1000 to about 3000 angstroms of silver. In an alternative embodiment, the reflective layer may be aluminum, having a thickness of about 1000 to about 3000 angstroms. In the next step, a metal support element will be constructed by plating. Conventional plating cannot be performed onto an aluminum layer, so if aluminum is used for reflective layer, an additional layer or layers must be added to provide a seed layer for plating. In one embodiment, for example, a layer of titanium, for example between about 200 and about 300 angstroms thick, is followed by a seed layer, for example of cobalt, which may have any suitable thickness, for example about 500 angstroms.

The metal support element is formed by plating on the reflective layer (a chromium/silver stack in this embodiment). To form a metal support element by electroplating, the wafer and associated layers are immersed in an electrolyte bath. An electrode is attached to the reflective layer, and a current passed through the electrolyte. Ions from the electrolyte bath build up on the reflective layer, forming a metal support element. The metal support element may be, for example, comprised of three layers: first a nickel layer may be applied, followed by an alloy of nickel, iron and cobalt, and finished with another layer of nickel. The Ni:Fe:Co alloy, has a coefficient of thermal expansion that is better matched to that of silicon than pure nickel, reducing stress during later steps.

Utilizing some nickel-only layers lowers the material cost compared to using Ni:Fe:Co for the full thickness of the metal support element. The thickness of metal support element may be as desired. The metal support element should be thick enough to provide structural support for the photovoltaic cell to be formed while maintaining a desired flexibility. For example, for thin wafers that are less than 30 μm thick, the metal support element should provide structural and flexural support for bends up to a 1 cm radius of curvature, while for thin wafers that are less than 150 μm thick, the metal support need only provide stability under flexural stress such the sagging of a rooftop photovoltaic module, (e.g., on the order of a 1 meter radius of curvature or less). One skilled in the art will select a suitable thickness and nickel:iron:cobalt ratio to balance these concerns. Thickness may be, for example, between about 25 and about 100 microns, for example about 50 microns. In some embodiments, the iron-nickel-cobalt alloy is between about 40 and about 65 percent iron, for example 54 percent iron. In some embodiments the metal support element will be a sandwich of three metal layers (e.g., Ni:FeCoNi:Ni). The nickel first and third layers may provide a diffusion barrier against Fe and other trace metals that may be present during the FeCoNi plating process.

A second amorphous silicon layer is deposited on the second surface. This layer is heavily doped silicon and may have a thickness, for example, between about 50 and about 350 angstroms. In this example, the second layer is heavily doped p-type, opposite the conductivity type of lightly doped n-type wafer, and serves as the emitter of the photovoltaic cell.

A transparent conductive oxide (TCO) layer is formed on and in immediate contact with the second amorphous silicon layer. Appropriate materials for TCO include indium tin oxide and aluminum-doped zinc oxide. This layer may be, for example, about between about 700 to about 1800 angstroms thick, for example about 900 angstroms thick. In some embodiments, a layer having a refractive index between that of the amorphous silicon layer and TCO layer, may be formed on the amorphous silicon layer, as described in Liang et al., U.S. patent application Ser. No. 12/894,254, "A Semiconductor with a Metal Oxide Layer Having Intermediate Refractive Index," filed Sep. 30, 2010, owned by the assignee of the present application and hereby incorporated by reference. Metal lines, for example of silver paste, may be formed on TCO layer, for example by screen printing, and cured at a relatively low temperature, for example about 180-250 degrees C.

A method has been described to fabricate a device, the method comprising providing a semiconductor wafer having a thickness of greater than 150 microns; etching to a desired thickness; forming a metal support element on or over the wafer; optionally etching further to a desired thickness and fabricating a photovoltaic cell, wherein the wafer comprises a base region of the photovoltaic cell.

A photovoltaic cell has been formed, including a lightly doped n-type wafer, which comprises the base of the cell, and a heavily doped p-type amorphous silicon layer, which serves as the emitter of the cell. Heavily doped n-type amorphous silicon layer will provide good electrical contact to the base region of the cell. Electrical contact must be made to both faces of the cell. Contact to the amorphous silicon layer is made by gridlines, by way of a TCO layer. The metal support element is conductive and is in electrical contact with the base contact by way of the conductive layer and TCO layer. The photovoltaic cells of a module are flexible and/or sag tolerant and generally electrically connected in series.

In the embodiments just described, etching was performed before the construction of a metal support element. In other embodiments, etching may be performed following the construction of a metal support element. A variety of embodiments have been provided for clarity and completeness. Clearly it is impractical to list all possible embodiments. Other embodiments of the invention will be apparent to one of ordinary skill in the art when informed by the present specification. Detailed methods of fabrication have been described herein, but any other methods that form the same structures can be used while the results fall within the scope of the invention.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention. Furthermore, those of ordinary skill in the art will appreciate that the foregoing description is by way of example only, and is not intended to limit the invention. Thus, it is intended that the present subject matter covers such modifications and variations.

What is claimed:

1. A method for forming a photovoltaic cell, the method comprising:
   a. providing a semiconductor wafer have a thickness greater than 150 µm, the wafer having a first surface and a second surface opposite the first;
   b. performing a first etching of the semiconductor wafer, wherein the first etching reduces the thickness of the semiconductor wafer to less than 40 µm;
   c. constructing a metal support element on or over the first surface; and
   d. fabricating a photovoltaic cell having a base, wherein the semiconductor wafer comprises the base of the photovoltaic cell,
      wherein a temporary carrier is applied to the second surface of the semiconductor wafer prior to the first etching.

2. The method of claim 1 wherein the metal support comprises nickel.

3. The method of claim 1 wherein the metal support has a coefficient of thermal expansion that is substantially the same as the semiconductor wafer.

4. The method of claim 1 wherein the metal support element on the first surface comprises a first layer comprising nickel on or above the first surface and a second layer comprising a nickel alloy on or above the first layer.

5. The method of claim 1 wherein the metal support element comprises electroplated nickel on or above the first surface.

6. The method of claim 4 wherein the nickel alloy comprises iron, cobalt or any combination thereof.

7. The method of claim 4 wherein the second layer comprising the nickel alloy is less than 25 µm thick.

8. The method of clam 4 wherein the first layer comprising nickel is less than 2 µm thick.

9. The method of claim 4 wherein the metal support element further comprises a third layer comprising nickel on the second layer.

10. The method of claim 1 wherein the photovoltaic cell is capable of adopting a radius of curvature that is less than about 1 meter.

11. The method of claim 1 wherein the semiconductor wafer is monocrystalline silicon.

12. The method of claim 1 further comprising the step of applying a first layer of amorphous silicon to the first surface of the semiconductor wafer, wherein the first layer of amorphous silicon is disposed between the wafer and the metal support.

13. The method of claim 1 wherein the step of fabricating a photovoltaic cell comprises applying a second layer of amorphous silicon to the second surface of the semiconductor wafer, and wherein the amorphous silicon comprises an emitter of the photovoltaic cell.

14. The method of claim 1 wherein the step of constructing a metal support element comprises constructing a continuous layer of metal on or over the first surface, wherein the continuous layer of metal covers the entire surface of wafer.

15. The method of claim 1 further comprising the step of applying a layer of amorphous silicon to the first surface of the semiconductor wafer prior to constructing the metal support element, and wherein the amorphous silicon layer comprises a contact to the base of the photovoltaic cell.

* * * * *